United States Patent
Yoshimura et al.

(10) Patent No.: US 6,740,170 B2
(45) Date of Patent: May 25, 2004

(54) APPARATUS AND METHOD FOR CLEANING PERIPHERAL PART OF SUBSTRATE

(75) Inventors: Takashi Yoshimura, Shinjuku-Ku (JP); Shoichi Murakami, Shinjuku-Ku (JP); Takeshi Sekiguchi, Shinjuku-Ku (JP); Nobunari Nadamoto, Shinjuku-Ku (JP)

(73) Assignee: Dai Nippon Printing Co., Ltd. (JP)

( * ) Notice: Subject to any disclaimer, the term of this patent is extended or adjusted under 35 U.S.C. 154(b) by 309 days.

(21) Appl. No.: 09/937,616

(22) PCT Filed: Feb. 5, 2001

(86) PCT No.: PCT/JP01/00800

§ 371 (c)(1), (2), (4) Date: Sep. 27, 2001

(87) PCT Pub. No.: WO01/56713

PCT Pub. Date: Aug. 9, 2001

(65) Prior Publication Data

US 2002/0153025 A1 Oct. 24, 2002

(30) Foreign Application Priority Data

Feb. 3, 2000 (JP) ........................................ 2000-026547

(51) Int. Cl.⁷ ................................................ B08B 1/04
(52) U.S. Cl. ............................ 134/6; 15/77; 15/88.3; 15/88.4; 15/102; 15/103.5
(58) Field of Search ..................... 15/77, 88.3, 88.4, 15/102, 103.5; 134/6

(56) References Cited

U.S. PATENT DOCUMENTS

| 5,675,856 A | * | 10/1997 | Itzkowitz ........................ 15/77 |
| 5,806,126 A | | 9/1998 | de Larios et al. .............. 15/102 |
| 5,875,507 A | * | 3/1999 | Stephens et al. ............... 15/102 |
| 6,041,465 A | * | 3/2000 | Yashiki et al. ................. 15/88.3 |

FOREIGN PATENT DOCUMENTS

| JP | 3-35145 | 7/1991 |
| JP | 07-051640 | 2/1995 |
| JP | 2000-011374 | 1/2000 |

* cited by examiner

Primary Examiner—Mark Spisich
(74) Attorney, Agent, or Firm—Parkhurst & Wendel, L.L.P.

(57) ABSTRACT

A cleaning apparatus (9) for cleaning a peripheral part of a substrate holds a peripheral part of a substrate (1) between the elastic porous member (29) of an upper cleaning roller (16) and an elastic porous member (30) of a lower cleaning roller (17). The power of a drive motor (13) is transmitted through a drive pulley (18), a belt (26) and a driven pulley (24) to a rotating shaft (17a) to rotate the lower cleaning roller (17), and is transmitted through a drive pulley (22), a belt (25) and a driven pulley (23) to a rotating shaft (16a) to rotate the upper cleaning roller (16) in a direction opposite the direction in which the lower cleaning roller (17) is rotated. A cleaning liquid is supplied through cleaning liquid supply nozzles (31) and cleaning liquid supply pipes (31a) into core members (27, 28). Then the cleaning liquid flows through connecting holes (35) formed in the circumferential walls of the core members (27, 28) and permeates the elastic porous members (29, 30). In this state, the upper cleaning roller (16) and the lower cleaning roller (17) are rotated, and the upper cleaning roller (16) and the lower cleaning roller (17) are moved relative to the substrate (1) by a base (11) along the peripheral part of the substrate (1) held between the elastic porous members (29, 30) of the upper and the lower cleaning rollers (16, 17). Splashing of the cleaning liquid can be effectively prevented and the quality of a high-definition pattern formed on the substrate (1) can be preserved.

13 Claims, 3 Drawing Sheets

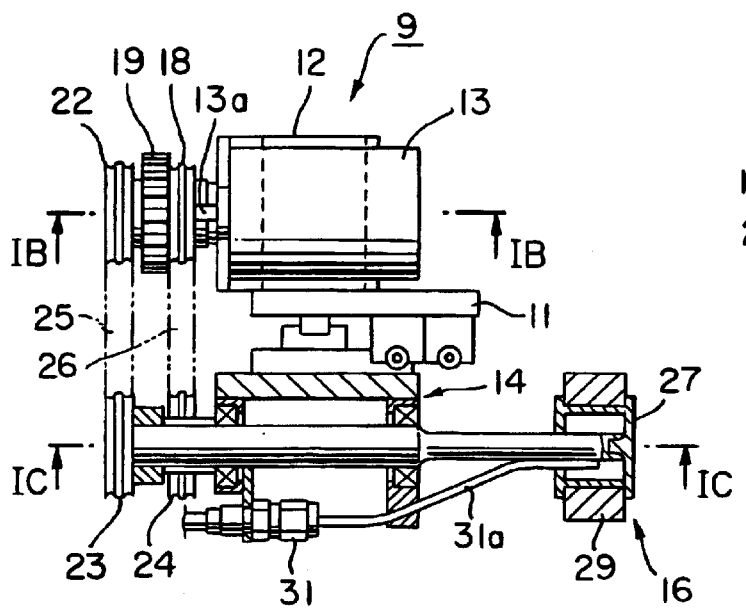
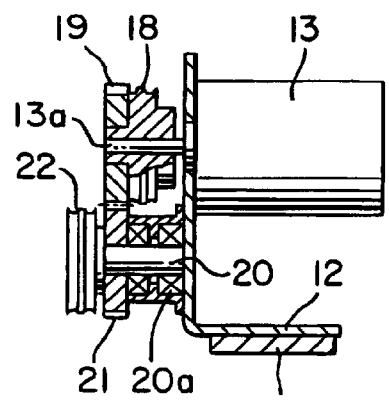
FIG. 1A
FIG. 1B
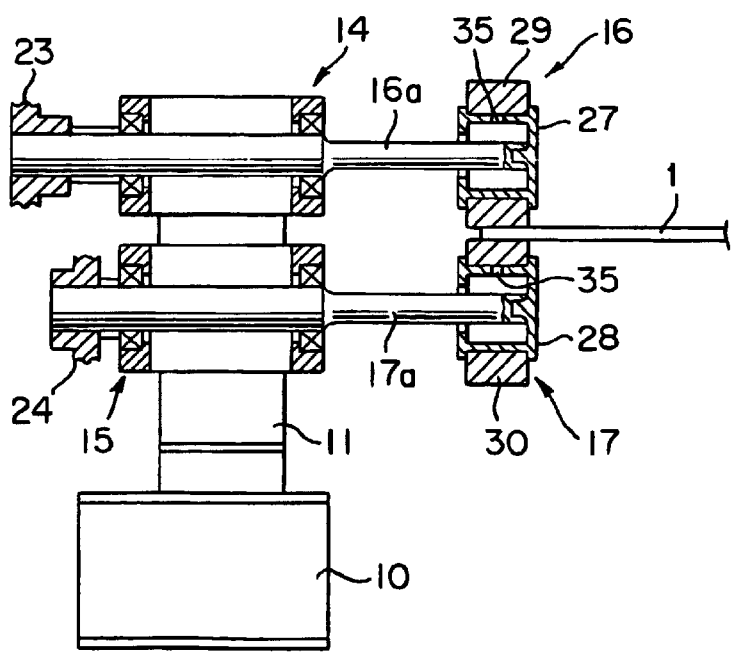
FIG. 1C

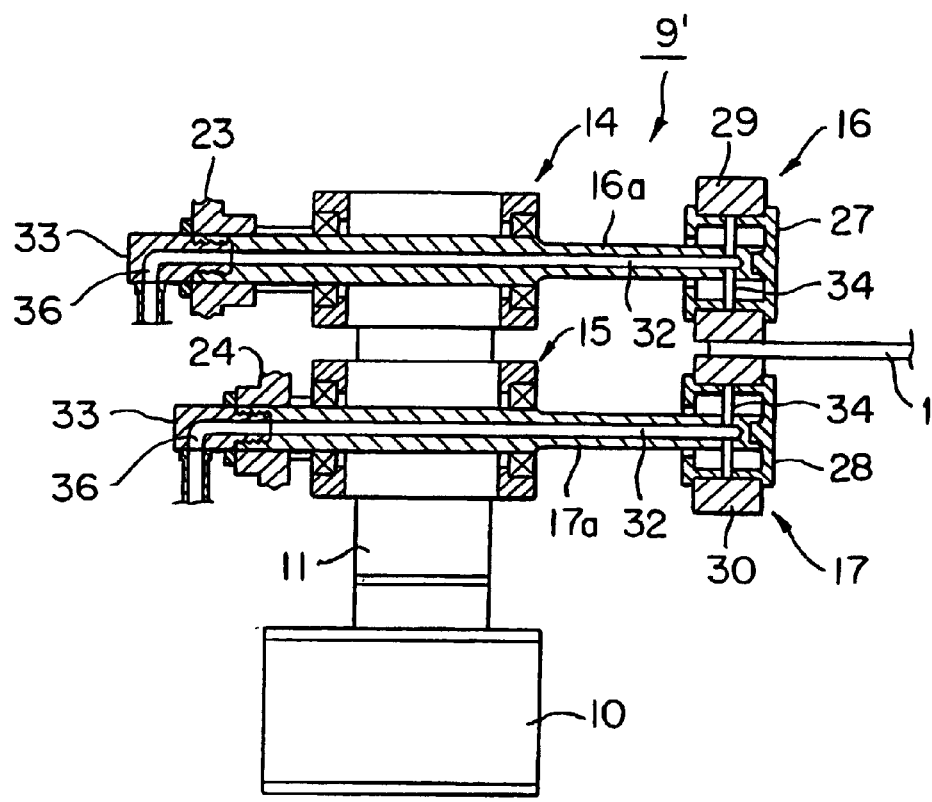
FIG. 3
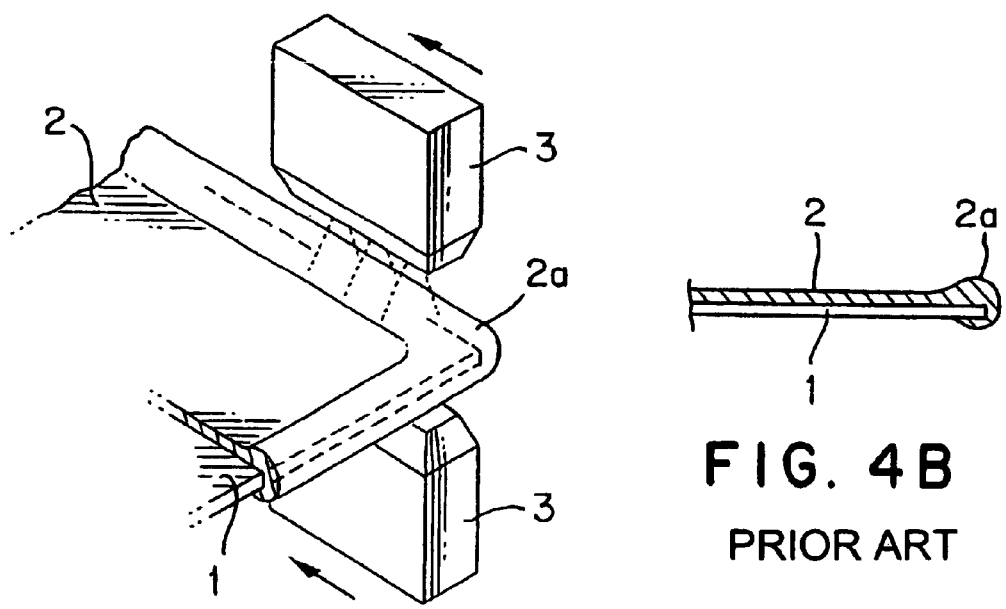
FIG. 4A PRIOR ART
FIG. 4B PRIOR ART

APPARATUS AND METHOD FOR CLEANING PERIPHERAL PART OF SUBSTRATE

BACKGROUND OF THE INVENTION

1. Field of the Invention

The present invention relates to the manufacture of a substrate provided with a high-definition pattern, such as a substrate provided with a semiconductor circuit, a substrate for a liquid crystal display or a color filter. More particularly, the present invention relates to a cleaning apparatus for cleaning a peripheral part of a substrate, to be employed in a coating process for coating a substrate, such as glass substrate, with a thin film, such as a resist film or a color layer, and a method to be carried out by such a cleaning apparatus.

2. Description of the Related Art

A color filter manufacturing method, for instance, includes a process for forming a chromium film on a substrate, such as a glass substrate, by a vacuum evaporation method or the like; a process for forming a black screening layer of a pattern of stripes or cross stripes by forming a photoresist film on the chromium film, exposing the photoresist film through a photomask to light, subjecting the exposed photoresist film to development, etching the chromium film through the photoresist and removing the photoresist; a process for forming a three-color layer consisting of three color layers, i.e., a R-layer, a G-layer and a B-layer, by coating a first-color photosensitive material on the black screening layer, placing a photomask on the first-color photosensitive material, exposing the first-color photosensitive material through the photomask to light and developing the exposed first-color photosensitive material, and repeating the same process for second-color and third-color layers; and a process for forming a transparent electrode layer by forming an indium tin oxide film (ITO film) on the three-color layer.

In the process for coating a color photosensitive material, the substrate is coated with a coating liquid of a color photosensitive material by a coating method, such as a spin coating method or a slit coating method. Such a coating method drips a coating liquid on a central part of a rotating substrate to spread the coating liquid over the substrate by centrifugal force. As shown in FIG. 4B, when a coating layer 2 is formed on the upper surface of a substrate 1 by this coating method, the coating liquid flows via the edge of the substrate 1 to the lower surface of the substrate 1 and a thick peripheral part 2a is formed on a peripheral part of the upper surface of the substrate 1. If the coating layer 2 having the thick peripheral part 2a is subjected to a developing process, the coating layer remains on the peripheral part of the substrate 1.

Thus, a conventional cleaning method uses a pair of cleaning nozzles 3 disposed opposite to each other so as to correspond to the peripheral part of the substrate 1 provided with the coating layer 2. The cleaning nozzles 3 are moved in the direction of the arrow, spraying a cleaning liquid (developer) on the peripheral part of the substrate 1 to clean the peripheral part of the substrate 1.

SUMMARY OF THE INVENTION

When the substrate 1 is cleaned by this conventional cleaning method, however, the substrate 1 splashes about the cleaning liquid sprayed through the cleaning nozzles 3 on the substrate 1 or the tips of the cleaning nozzles 3 touch the substrate 1, so that the cleaning liquid wets the surface of the substrate 1 other than the peripheral part, which is apt to degrade the quality of the high-definition pattern formed on the substrate 1.

The present invention has been made in view of such problems and it is therefore an object of the present invention to provide an apparatus and method for cleaning a peripheral part of a substrate, capable of effectively preventing the splashing of a cleaning liquid and of preventing the degradation of the quality of a high-definition pattern formed on the substrate.

A cleaning apparatus according to an aspect of the present invention for cleaning a peripheral part of a substrate comprises an upper cleaning roller supported for rotation on a base, and including a core member and an elastic porous member covering the circumference of the core member; a lower cleaning roller supported for rotation on the base, including a core member and an elastic porous member covering the circumference of the core member, and capable of holding a peripheral part of the substrate together with the elastic porus member of the upper cleaning roller; a drive mechanism for driving the upper cleaning roller and the lower cleaning roller for rotation; a moving mechanism for moving the upper cleaning roller and the lower cleaning roller relative to the substrate; and a cleaning liquid supply system for supplying a cleaning liquid to at least either the elastic porous member of the upper cleaning roller or that of the lower cleaning roller.

In the cleaning apparatus of the present invention, it is preferable that the cleaning liquid supply system has a cleaning liquid supply pipe to supply the cleaning liquid to the elastic porous members. It is preferable that the core member is a hollow member having a circumferential wall provided with holes, and the cleaning liquid carried by the cleaning liquid supply pipe is supplied through the interior and the holes of the core member to the elastic porous member.

In the cleaning apparatus of the present invention, it is preferable that at least either the upper cleaning roller or the lower cleaning roller is supported for rotation on the base by a rotating shaft, and the cleaning liquid supply system has a cleaning liquid passage formed in the rotating shaft supporting the upper cleaning roller or the lower cleaning roller to supply the cleaning liquid to the elastic porous member. It is preferable that the core member is provided with a connecting passage connected to the cleaning liquid passage of the rotating shaft and opening into the elastic porous member to supply the cleaning liquid carried by the cleaning liquid passage of the rotating shaft to the elastic porous member. It is preferable that the core member is a hollow member having a circumferential wall provided with holes, and the cleaning liquid supplied through the cleaning liquid passage of the rotating shaft is supplied through the interior and the holes of the core member to the elastic porous member.

Preferably, the upper cleaning roller and the lower cleaning roller are interlocked and the drive mechanism is provided with a single drive motor for driving the upper cleaning roller and the lower cleaning roller.

A cleaning method of cleaning a peripheral part of a substrate according to a second aspect of the present invention comprises the steps of holding a peripheral part of a substrate between respective elastic porous members of upper and lower cleaning rollers; supplying a cleaning liquid to at least either the elastic porous member of the upper cleaning roller or that of the lower cleaning roller; and rotating the upper cleaning roller and the lower cleaning roller, moving the upper cleaning roller and the lower cleaning roller relative to the substrate held between the elastic porous members of the upper cleaning roller and the lower cleaning roller.

According to the present invention, the cleaning liquid is supplied to the elastic porous members of the upper and the lower cleaning rollers with the substrate held between the elastic porous members of the upper and the lower cleaning rollers, and the upper and the lower cleaning roller are rotated and moved relative to the substrate. Thus, the splashing of the cleaning liquid can be effectively prevented when removing a thick part on the peripheral part of the substrate of the film formed on the substrate and, consequently, the quality of the high-definition pattern formed on the substrate can be preserved.

BRIEF DESCRIPTION OF THE DRAWINGS

FIGS. 1A, 1B and 1C are a partly sectional plan view, a sectional view taken on line IB—IB in FIG. 1A and a sectional view taken on line IC—IC in FIG. 1A, respectively, of a cleaning apparatus in an embodiment according to the present invention for cleaning a peripheral part of a substrate, in which parts behind those shown therein are omitted properly;

FIG. 3 is a sectional view, similar to FIG. 1C, of a cleaning apparatus in another embodiment according to the present invention for cleaning a peripheral part of a substrate; and FIGS. 4A and 4B are views of assistance in explaining a conventional cleaning apparatus for cleaning a peripheral part of a substrate.

DESCRIPTION OF THE PREFERRED EMBODIMENTS

Figure 2A:
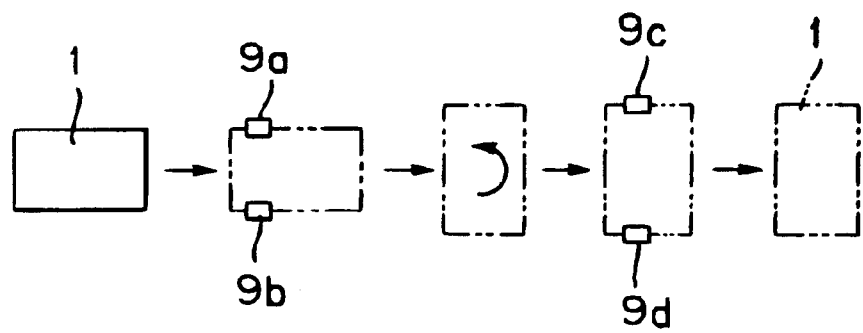
FIGS. 2A and 2B are diagrammatic views of assistance in explaining a cleaning method using the cleaning apparatus shown in FIGS. 1A, 1B and 1C.

Preferred embodiments of the present invention will be described with reference to the accompanying drawings.

A cleaning apparatus in an embodiment according to the present invention for cleaning a peripheral part of a substrate will be described with reference to FIGS. 1A, 1B, 1C and 2A and 2B.

Referring to FIGS. 1A, 1B and 1C, a cleaning apparatus 9 in an embodiment according to the present invention includes a moving base (base) 11, which is driven for movement in parallel to a surface of a substrate 1 along a rail 10 by a motor, not shown, a drive motor 13 fixedly held on a bracket 12 attached to the moving base 11, an upper cleaning roller 16 mounted on a shaft 16a supported for rotation by a bearing unit 14 on the moving base 11, and a lower cleaning roller 17 mounted on a shaft 17a supported for rotation by a bearing unit 15 on the moving base 11. The moving base 11 is included in a moving mechanism for moving the upper cleaning roller 16 and the lower cleaning roller 17 relative to the substrate 1.

A first drive pulley 18 and a drive pinion 19 are fixedly mounted on the output shaft 13a of the drive motor 13. A rotating shaft 20 is supported for rotation in parallel to the output shaft 13a of the drive motor 13 in bearings 20a on the bracket 12. A driven gear 21 and a second drive pulley 22 are fixedly mounted on the rotating shaft 20. The driven gear 21 is engaged with the drive pinion 19.

The upper cleaning roller 16 and the lower cleaning roller 17 are mounted on end parts of the shafts 16a and 17a, respectively. Driven pulleys 23 and 24 are fixedly mounted on the other end parts of the rotating shafts 16a and 17a, respectively. A belt 25 is extended between the second drive pulley 22 and the driven pulley 23 fixed to the rotating shaft 16a. A belt 26 is extended between the first drive pulley 18 and the driven pulley 24 fixed to the rotating shaft 17a. The drive motor 13, the drive pulleys 18 and 22, the drive pinion 19, the driven gear 21, the driven pulleys 23 and 24, the belts 25 and 26 and the rotating shafts 16a and 17a constitute a rotative drive mechanism for driving the upper cleaning roller 16 and the lower cleaning roller 17 for coordinated rotation.

The upper cleaning roller 16 and the lower cleaning roller 17 have tubular (hollow) core members 27 and 28, and spongy, elastic porous members 29 and 30 coating the circumferences of the core members 27 and 28, respectively. A peripheral part of a substrate 1 is held between the elastic porous member 29 of the upper cleaning roller 16 and the elastic porous member 30 of the lower cleaning roller 17 as shown in FIG. 1C. Each of the core members 27 and 28 is provided in its circumferential wall with one or more connecting holes 35 as shown in FIG. 1C.

Cleaning liquid supply nozzles 31 are attached to the bearing units 14 and 15, respectively, and are connected to a cleaning liquid tank, not shown. Cleaning liquid supply pipes 31a are connected to the cleaning liquid supply nozzles 31. Extremities of the cleaning liquid supply pipes 31a are inserted in the core members 27 and 28, respectively, to supply a cleaning liquid into the core members 27 and 28. The cleaning liquid supplied into the core members 27 and 28 is supplied through the connecting holes 35 to the elastic porous members 29 and 30. The cleaning liquid tank, not shown, the cleaning liquid supply nozzles 31 and the cleaning liquid supply pipes 31a constitute a cleaning liquid supply system for supplying the cleaning liquid to the respective elastic porous members 29 and 30 of the upper cleaning roller 16 and the lower cleaning roller 17.

The operation of the cleaning apparatus thus constructed will be described hereinafter.

A peripheral part of the substrate 1 is held between the respective elastic porous members 29 and 30 of the upper cleaning roller 16 and the lower cleaning roller 17. As shown in FIG. 1C, the substrate 1 is thus held so that the peripheral part may not project from the elastic porous members 29 and 30. The width of the peripheral part held between the elastic porous members 29 and 30, the respective heights and positions of the elastic porous members 29 and 30 are adjusted properly by an adjusting mechanism, not shown.

Then the drive motor 13 is actuated. The rotation of the drive motor 13 is transmitted through the drive pulley 18, the belt 26 and the driven pulley 24 to the rotating shaft 17a to rotate the lower cleaning roller 17, and is transmitted through the drive pulley 22, the belt 25 and the driven pulley 23 to the rotating shaft 16a to rotate the upper cleaning roller 16 in a direction opposite the direction of rotation of the lower cleaning roller 17. The cleaning liquid is supplied through the cleaning nozzles 31 and the cleaning liquid supply pipes 31a into the core members 27 and 28. Then the cleaning liquid soaks through the connecting holes 35 formed in the circumferential walls of the core members 27 and 28 into the elastic porous members 29 and 30.

Thus, the upper cleaning roller 16 and the lower cleaning roller 17 thus rotated is moved along the peripheral part of the substrate 1 held between the elastic porous members 29 and 30 of the upper cleaning roller 16 and the lower cleaning roller 17 relative to the substrate 1 by the moving base 11.

Thus, a thick part (the thick part 2a shown in FIG. 4B) formed in the peripheral part of the substrate 1 can be cleaned and removed.

Figure 2B:
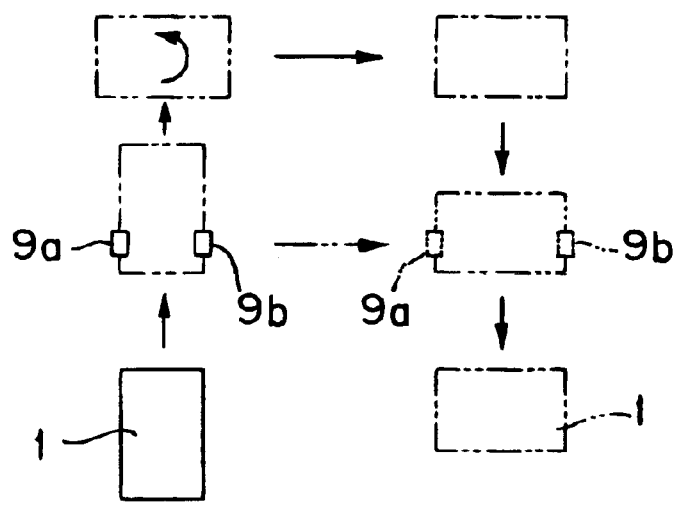

FIGS. 2A and 2B illustrates methods of cleaning peripheral parts extending along the four sides of the substrate 1 by the cleaning apparatus 9. In FIGS. 2A and 2B, indicated at 9a, 9b, 9c and 9d are cleaning apparatuses (roller units each provided with an upper cleaning roller 16 and a lower cleaning roller 17) similar to the cleaning apparatus 9 shown in FIGS. 1A, 1B and 1C.

FIG. 2A is a view of assistance in explaining a first cleaning method. The four cleaning apparatuses 9a, 9b, 9c and 9d are arranged as shown in FIG. 2A to clean the peripheral parts extending along the four edges of the substrate 1. The peripheral parts extending along the opposite side edges of the substrate 1 are cleaned by the cleaning apparatuses 9a and 9b, the substrate 1 is turned through an angle of 90°, and then the peripheral parts extending along the opposite end edges of the substrate 1 are cleaned by the cleaning apparatuses 9c and 9d.

FIG. 2B is a view of assistance in explaining a second cleaning method. The two cleaning apparatuses 9a and 9b are arranged as shown in FIG. 2B to clean the peripheral parts extending along the four edges of the substrate 1. The peripheral parts extending along the opposite side edges of the substrate 1 are cleaned by the cleaning apparatuses 9a and 9b, the substrate 1 is turned through an angle of 90°, the cleaning devices 9a and 9b are moved while the distance between the cleaning devices 9a and 9b are increased, and then the peripheral parts extending along the opposite end edges of the substrate 1 are cleaned by the cleaning apparatuses 9a and 9b.

The cleaning apparatus in this embodiment supplies the cleaning liquid to the respective elastic porous members 29 and 30 of the upper cleaning roller 16 and the lower cleaning roller 17 holding the peripheral part of the substrate 1 therebetween, rotates the upper cleaning roller 16 and the lower cleaning roller 17, and moves the upper cleaning roller 16 and the lower cleaning roller 17 relative to the substrate 1. Thus, the thick part formed on the peripheral part of the substrate 1 can be cleaned and removed, effectively preventing the splashing of the cleaning liquid, so that the quality of the high-definition pattern formed on the substrate 1 can be preserved.

In this embodiment, the substrate 1 is held stationary and the upper cleaning roller 16 and the lower cleaning roller 17 are moved relative to the substrate 1. Since it is necessary to move the upper cleaning roller 16 and the lower cleaning roller 17 relative to the substrate 1, the upper cleaning roller 16 and the lower cleaning roller 17 may be kept stationary and the substrate 1 may be moved relative to the upper cleaning roller 16 and the lower cleaning roller 17.

Although the cleaning liquid is supplied to both the elastic porous members 29 and 30 in this embodiment, the cleaning liquid supply nozzle 31 and the cleaning liquid supply pipe 31a may be combined with only either the core member 27 or 28, and the cleaning liquid may be made to percolate through both the elastic porous members 29 and 30 in contact with each other by the agency of the property of the porous structure of the elastic porous members 29 and 30.

Another Emodiment

A cleaning apparatus in another embodiment according to the present invention for cleaning a peripheral part of a substrate will be described with reference to FIG. 3. The cleaning apparatus in another embodiment shown in FIG. 3 is substantially the same as the cleaning apparatus in the embodiment shown in FIGS. 1A, 1B, 1C and 2, except that a cleaning liquid supply system is different from that of the above-mentioned embodiment. Therefore, parts shown in FIG. 3 like or corresponding to those of the cleaning apparatus in the above-mentioned embodiment are denoted by the same reference characters and the description thereof will be omitted.

Referring to FIG. 3, a cleaning apparatus 9' in this embodiment has rotating shafts 16a and 17a respectively supporting an upper cleaning roller 16 and a lower cleaning roller 17 on end parts thereof. Axial cleaning liquid supply passages 32 are formed in the rotating shafts 16a and 17a, respectively. Rotary joints 33 provided with cleaning liquid passages 36 are connected to the other end parts of the rotating shafts 16a and 17a. The rotary joints 33 are connected to a cleaning liquid tank, not shown. The cleaning liquid passages 36 of the rotary joints 33 are connected to the cleaning liquid passages 32 of the rotating shafts 16a and 17a, respectively. Radial passages 34 are formed in core members 27 and 28 so as to extend radially from the rotating shafts 16a and 17a and to open into porous members 29 and 30, respectively. A cleaning liquid supplied through the cleaning liquid passages 36 of the rotary joints 33 and the cleaning liquid supply passages 32 of the rotating shafts 16a and 17a is supplied through the connecting passages 34 to the elastic porous members 29 and 30. The cleaning liquid passages 36 of the rotary joints 33, the cleaning liquid supply passages 32 of the rotating shafts 16a and 17a, and the connecting passages 34 constitute a cleaning liquid supply system for supplying the cleaning liquid to the elastic porous members 29 and 30 of the upper cleaning roller 16 and the lower cleaning roller 17.

Although the cleaning liquid passages 32 of the rotating shafts 16a and 17a are connected directly to the circumferential walls of the core members 27 and 28 by the connecting passages 34 in this embodiment, the circumferential walls of the core members 27 and 28 may be provided, similarly to those of the first embodiment shown in FIGS. 1A, 1B and 1C, connecting holes 35, and the cleaning liquid supplied through the cleaning liquid passages 32 may be supplied through the interiors of the core members 27 and 28 and the connecting holes 35 to the elastic porous members 29 and 30.

The present invention is not limited in its practical application to the preferred embodiments specifically described herein and various changes may be made therein.

What is claimed is:

1. A cleaning method of cleaning four peripheral parts extending along four edges of a rectangular substrate, comprising the steps of:

providing at least a pair of first cleaning apparatuses placed on opposite sides of a direction of relative movement of the rectangular substrate at an interval corresponding to a distance between first opposite edges of the rectangular substrate, and at least a pair of second cleaning apparatuses placed on the opposite edges of the direction of relative movement of the rectangular substrate at an interval corresponding to a distance between second opposite edges of the rectangular substrate, each of said first and second cleaning apparatus including an upper cleaning roller and a lower cleaning roller;

holding first opposite peripheral parts extending along the first opposite edges of the rectangular substrate by said respective first cleaning apparatuses, with the respective first opposite peripheral parts of the rectangular substrate being held between elastic porous members of the upper and lower cleaning rollers of said respective first cleaning apparatus;

supplying a cleaning liquid to at least either the elastic porous member of the upper cleaning roller or that of the lower cleaning roller of said respective first cleaning apparatuses;

rotating the upper and lower cleaning rollers of said respective first cleaning apparatuses, while moving the respective upper and lower cleaning rollers relative to the rectangular substrate along the direction of relative movement of the rectangular substrate, with the respective first peripheral parts of the rectangular substrate being held between the elastic porous members of the upper and lower cleaning rollers of said respective first cleaning apparatuses;

turning the rectangular substrate in a plane thereof through an angle of 90° so that second opposite edges of the rectangular substrate are placed at said respective second cleaning apparatuses after the first opposite peripheral parts of the rectangular substrate are cleaned by said respective first cleaning apparatuses; and cleaning second opposite peripheral parts extending along the second opposite edges of the rectangular substrate by said cleaning apparatuses by repeatedly conducting said holding step, said supplying step and said rotating step with respect to the second opposite parts of the rectangular substrate.

2. The cleaning method according to claim 1, wherein the rectangular substrate to be cleaned is a substrate for a color filter.

3. A cleaning method of cleaning four peripheral parts extending along four edges of a rectangular substrate, comprising the steps of:

providing at least a pair of cleaning apparatuses placed on opposite sides of a direction of relative movement of the rectangular substrate at an interval corresponding to a distance between first opposite edges of the rectangular substrate, each of said cleaning apparatuses including an upper cleaning roller and a lower cleaning roller;

holding first opposite peripheral parts extending along the first opposite edges of the rectangular substrate by said respective cleaning apparatuses, with the respective first opposite peripheral parts of the rectangular substrate being held between elastic porous members of the upper and lower cleaning rollers of said respective cleaning apparatuses;

supplying a cleaning liquid to at least either the elastic porous member of the upper cleaning roller or the elastic porous member of the lower cleaning roller of said respective cleaning apparatuses;

rotating the upper and lower cleaning rollers of said respective cleaning apparatuses, while moving the respective upper and lower cleaning rollers relative to the rectangular substrate along the direction of relative movement of the rectangular substrate, with the respective first peripheral parts of the rectangular substrate being held between the elastic porous members of the upper and lower cleaning rollers of said respective cleaning apparatuses;

turning the rectangular substrate in a plane thereof through an angle of 90° so that second opposite edges of the rectangular substrate are placed at said respective cleaning apparatuses after the first opposite peripheral parts of the rectangular substrate are cleaned by said respective cleaning apparatuses;

adjusting a distance between said cleaning apparatuses in accordance with a distance between the second opposite edges of the rectangular substrate; and cleaning second opposite peripheral parts extending along the second opposite edges of the rectangular substrate by said cleaning apparatuses by repeatedly conducting said holding step, said supplying step and said rotating step with respect to the second opposite peripheral parts of the rectangular substrate.

4. The cleaning method according to claim 3, wherein the rectangular substrate to be cleaned is a substrate for a color filter.

5. A cleaning system comprising:

at least a pair of cleaning apparatuses placed on opposite sides of a direction of relative movement of a rectangular substrate at an interval corresponding to a distance between opposite edges of the rectangular substrate;

means for turning the rectangular substrate with respect to said cleaning apparatuses in a plane thereof through an angle of 90°;

wherein said cleaning apparatuses are placed on opposite sides of a direction of relative movement of the rectangular substrate at an interval corresponding to a distance between the opposite edges of the rectangular substrate, and each of said respective cleaning apparatuses includes: an upper cleaning roller supported for rotation on a base and including a core member and an elastic porous member covering a circumference of the core member; a lower cleaning roller supported for rotation on the base, including a core member and an elastic porous member covering a circumference of the core member and capable of holding a peripheral part of the rectangular substrate together with the elastic porous member of the upper cleaning roller; a drive mechanism for driving the upper cleaning roller and the lower cleaning roller for rotation; a moving mechanism for moving the upper cleaning roller and the lower cleaning roller relative to the rectangular substrate; and a cleaning liquid supply system for supplying a cleaning liquid to at least either the elastic porous member of the upper cleaning roller or the elastic porous member of the lower cleaning roller.

6. The cleaning system according to claim 5, wherein a distance between maid cleaning apparatuses is adjusted in accordance with a distance between the opposite edges of the rectangular substrate.

7. The cleaning system according to claim 5, wherein each of the cleaning liquid supply systems of said cleaning apparatuses has a cleaning liquid supply pipe to supply the cleaning liquid to the elastic porous member.

8. The cleaning system according to claim 7, wherein each of the core members of said cleaning apparatuses is a hollow member having a circumferential wall provided with a hole, and the cleaning liquid carried by the cleaning liquid supply pipe is supplied through an interior and the hole of the core member to the elastic porous member.

9. The cleaning system according to claim 5, wherein at least either the upper cleaning roller or the lower cleaning roller of each of said cleaning apparatuses is supported for rotation on the base by a rotating shaft and each of the cleaning liquid supply systems of said cleaning apparatuses has a cleaning liquid passage formed in the rotating shaft supporting the upper cleaning roller or the lower cleaning roller to supply the cleaning liquid to the elastic porous member.

10. The cleaning apparatus according to claim 9, wherein each of the core members of said cleaning apparatuses is provided with a connecting passage connected to the cleaning liquid passage of the rotating shaft and opening into the elastic porous member to supply the cleaning liquid carried by the cleaning liquid passage of the rotating shaft to the elastic porous member.

11. The cleaning system according to claim 9, wherein each of the core members of said cleaning apparatuses is a hollow member having a circumferential wall provided with a hole, and the cleaning liquid supplied through the cleaning liquid passage of the rotating shaft is supplied through an interior and the hole of the core member to the elastic porous member.

12. The cleaning system according to claim 5, wherein the upper cleaning roller and the lower cleaning roller of said cleaning apparatuses are interlocked and each of the drive mechanisms of said cleaning apparatuses is provided with a single drive motor for driving the upper cleaning roller and the lower cleaning roller.

13. The cleaning system according to claim 5, wherein the rectangular substrate to be cleaned is a substrate for a color filter.

* * * * *